US006404303B1

United States Patent
Kuroda

(10) Patent No.: US 6,404,303 B1
(45) Date of Patent: Jun. 11, 2002

(54) SURFACE ACOUSTIC WAVE ELEMENT WITH AN INPUT/OUTPUT GROUND PATTERN FORMING CAPACITANCE WITH BOTH THE INPUT AND OUTPUT SIGNAL PATTERNS

(75) Inventor: Yasushi Kuroda, Hokkaido (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/623,461

(22) PCT Filed: Jan. 12, 2000

(86) PCT No.: PCT/JP00/00107

§ 371 (c)(1),
(2), (4) Date: Sep. 12, 2000

(87) PCT Pub. No.: WO00/42704

PCT Pub. Date: Jul. 20, 2000

(30) Foreign Application Priority Data

Jan. 12, 1999 (JP) ............................................. 11-005388

(51) Int. Cl.[7] ................................................. H03H 9/64
(52) U.S. Cl. ....................................... 333/193; 333/195
(58) Field of Search ................................. 333/193–196; 310/313 R, 313 B, 313 C, 313 D

(56) References Cited

U.S. PATENT DOCUMENTS 4,314,215 A * 2/1982 Tanji et al. .................. 333/193

5,945,893 A * 8/1999 Plessky et al. ............ 333/193 X

FOREIGN PATENT DOCUMENTS

| JP | 58-131810 | * | 8/1983 | .................. 333/193 |
| JP | 9-162676 | * | 6/1997 | |
| JP | 9-172342 | * | 6/1997 | |

* cited by examiner

Primary Examiner—Robert Pascal
Assistant Examiner—Barbara Summons
(74) Attorney, Agent, or Firm—Oblon, Spivak, McClelland, Maier & Neustadt, P.C.

(57) ABSTRACT

Due to flip-chip assembling, a surface acoustic wave device can be miniaturized and improved in high frequency characteristics. Despite that, since a resonant system cannot be formed due to an absence of inductance of bonding wire, there is a problem that an attenuation region cannot be disposed in a frequency band apart from the pass band. In order to solve the problem, ground terminal wired to interdigital electrodes of a two-port surface acoustic wave element is extended facing to facing to both output sides of both input and output signal terminals to form capacitance. Due to a resonant system including the capacitance, in a frequency band apart from a pass band of the surface acoustic wave element an attenuation region is formed. Thereby, a surface acoustic wave device that is flexibly adjustable of frequency characteristics in response to system request, can be miniaturized and is improved in characteristics out of band is provided.

7 Claims, 14 Drawing Sheets

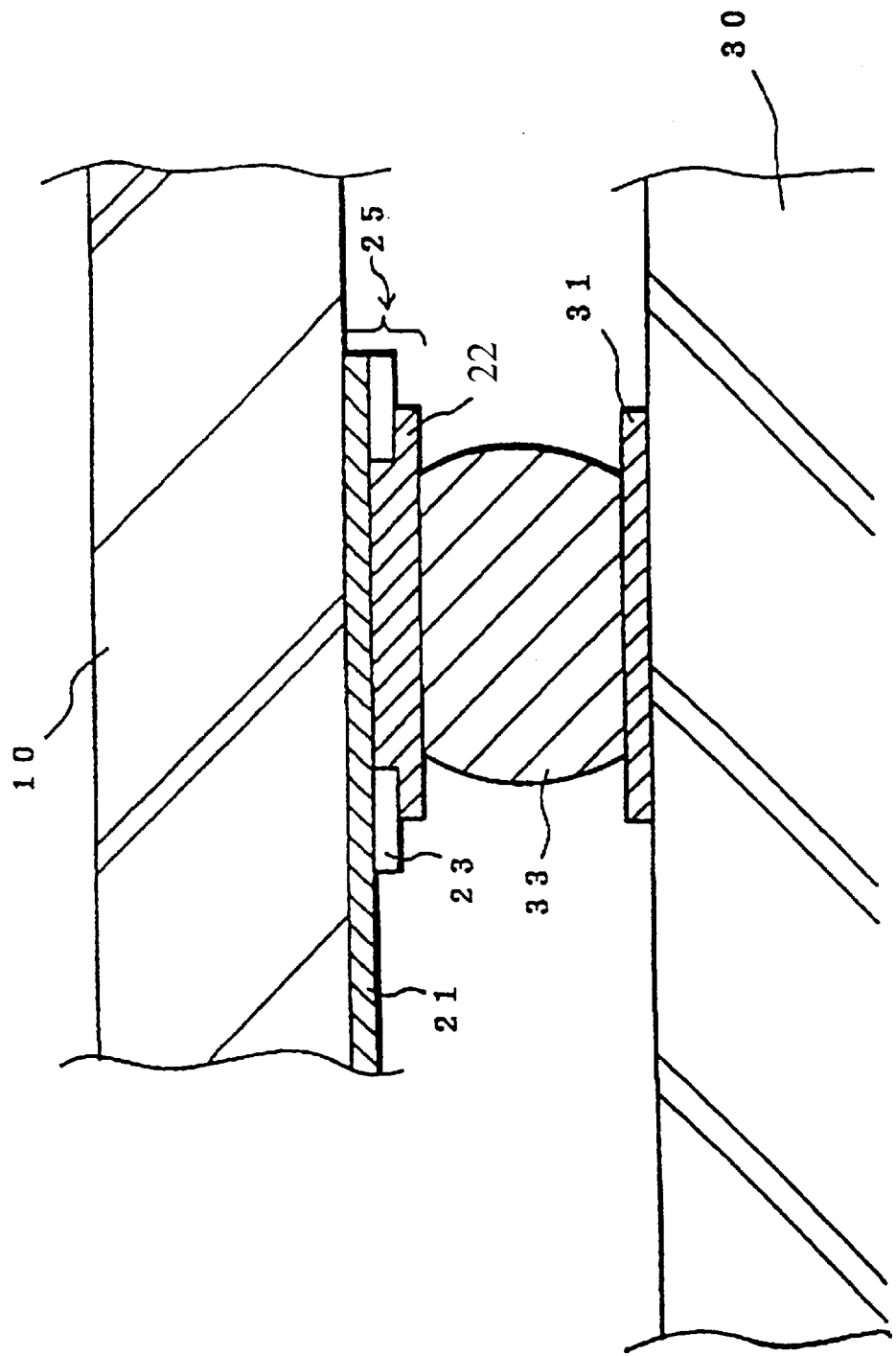

SURFACE ACOUSTIC WAVE ELEMENT WITH AN INPUT/OUTPUT GROUND PATTERN FORMING CAPACITANCE WITH BOTH THE INPUT AND OUTPUT SIGNAL PATTERNS

TECHNICAL FIELD

The present invention relates to a surface acoustic wave element, in particular to a surface acoustic wave element such as a surface acoustic wave filter used for mobile communication. Further, the present invention relates to a surface acoustic wave element suitable for flip-chip assembling and a surface acoustic wave device in which a surface acoustic wave element is mounted on a package, in particular to a surface acoustic wave device such as a band pass filter in microwave stage in which a surface acoustic wave element is flip-chip assembled.

BACKGROUND ART

Recently, surface acoustic wave elements such as surface acoustic wave filters are much in use in mobile communication in which demand for miniaturization is strong. For this use, a piezoelectric substrate thereon a surface acoustic wave filter is formed is adhered to the inside of a ceramic package, and signal input/output terminals disposed inside of the package and bonding pads on the piezoelectric substrate are connected with bonding wires consisting of Au, Al or the like to mount. Thereafter, a metal cap is put thereon and welded to a metal frame at the upper portion of the package, thereby hermetic sealing the surface acoustic wave element in the package.

The signal terminal in the package is communicated with an external terminal of the package through a via-hole or a castellation. The package is mounted on for instance a printed wiring board, external circuit and the external terminal of the package being connected. Thus formed surface acoustic wave filter, being capable of surface mounting on a printed circuit board during assembling, can be assembled with high density. Accordingly, the surface acoustic wave filters thus formed are components suitable in miniaturizing an electronic instrument such as portable telephones or the like.

There is flip-chip assembly technique that is recently used as an assembly technique capable of further miniaturizing a surface acoustic wave element. In the flip-chip assembly technique, a surface acoustic wave element is face down bonded on a package called an envelope. In the flip-chip assembly technique, conductive bumps are formed of Au or the like on portions where electrical connection of the surface acoustic wave element is necessary, which is put opposite on a printed circuit board of the envelope thereon conductive patterns are formed, followed by heating or ultrasonic inputting to connect.

The conductive pattern of the printed circuit board is connected to an external terminal disposed on a bottom surface of the printed circuit board. After thus mounting the surface acoustic wave element on the envelope, a cap is put on the envelope to hermetic seal the surface acoustic wave element.

Thus, in the flip-chip assembly technique, since the bonding wire is not used, a portion for wire bonding is not necessary on the package. Further, in bonding due to the wire bonding, there is a necessity of ensuring an excess space in the envelope for introducing a tool that introduces the bonding wire and connects with the bonding pad. On the contrary, in the flip-chip connection, the bonding tool is not necessary to result in cutting down the excess space.

Thus, the flip-chip assembly technique is an assembling method suitable for miniaturization of a surface acoustic wave device.

A surface acoustic wave filter, having a steep rise frequency characteristic, is a device of excellent frequency selectivity suitable for the case where high attenuation characteristic is necessary particularly in the neighborhood of a pass band.

However, in the surface acoustic wave filter, in a frequency band far apart from the pass band, the frequency characteristics of the surface acoustic wave filter are largely affected by stray capacitance of the package thereon the surface acoustic wave element is mounted, inductance of bonding wire, mutual inductions between a plurality of bonding wires or the like. Accordingly, there are problems that attenuation characteristics intrinsic to the surface acoustic wave filter cannot be sufficiently obtained.

Accordingly, when for the surface acoustic wave filter, attenuation characteristic in a frequency band far apart from a pass band is demanded, a technique that another resonant system is formed in the surface acoustic wave device and a trap due to the resonant system is fitted in a frequency band far apart from the pass band has been frequently used.

With such a configuration, the surface acoustic wave filter, when used for a portable telephone for instance, can improve the attenuation characteristics at a frequency band of a local oscillator or image frequency that are apart from a transmitting band or a receiving band.

Usually, these bands are frequency bands several hundreds MHz apart from the pass band. At that time, to form a trap of a surface acoustic wave filter, a resonant system due to inductance of the bonding wires and that of routing electrode pattern, and stray capacitance in the package and that of the routing portion has been mostly used.

As mentioned above, to advance miniaturization of the surface acoustic device, the flip-chip assembly technique is preferably adopted. When flip-chip mounting is implemented, however, due to an absence of the bonding wire, there is no inductance pertaining to the bonding wire. In addition, in flip-chip assembling, the bump connecting between the surface acoustic wave element and the envelope has a magnitude of approximately several tens $\mu$m. As a result, compared with the bonding wire, the inductance is remarkably small. Accordingly, it was difficult to obtain a resonant system that forms a trap in a frequency band several hundreds MHz apart from the pass band due to inductance of the bump and that of the routing electrode pattern, and stray capacitance in the package and that of the routing portion.

In the case of the flip-chip assembling being adopted, there is no mutual induction between the bonding wires. As a result, there is an advantage that characteristics in a broad band, particularly in a high frequency region of 3 GHz or more, can be improved. Despite that, it is difficult to obtain an attenuation region such as the trap in the frequency band approximately several hundreds MHz apart from the pass band. As a result, there are problems that the flip-chip mounted surface acoustic wave devices cannot be used in various kinds of mobile communication systems including portable telephones, PHSs or the like.

DISCLOSURE OF THE INVENTION

The present inventions were carried out to solve these problems.

That is, an object of the present invention is to provide a surface acoustic wave element that can be miniaturized and can be improved of characteristics out of band.

Another object of the present invention is to provide a surface acoustic wave device that even when flip-chip assembling a surface acoustic wave element, can achieve both the miniaturization and the improvement of characteristics out of band. In particular, the object is to provide a surface acoustic wave filter having high attenuation characteristics even in a frequency band several hundreds MHz apart from a pass band.

Still another object of the present invention is to provide a surface acoustic wave element capable of adjusting attached capacitance with a high degree of freedom.

Still another object of the present invention is to provide a surface acoustic wave element that has large mechanical strength at a bump formation portion suitable for the flip-chip assembling and a structure of high connection reliability.

In order to solve these problems, the present invention adopts a configuration described in the following.

A surface acoustic wave element of the present invention comprises a piezoelectric substrate and a two-port surface acoustic wave resonator filter having input IDT (interdigital transducer) and output IDT. Here, one of a pair of interdigital electrodes constituting the input IDT is connected to an input side signal conductive pattern including an input side signal wiring and an input signal terminal, the other one being connected to an input side ground conductive pattern including an input side ground wiring and an input side ground terminal. One of a pair of interdigital electrodes constituting the output IDT is wired to an output side signal conductive pattern including an output side signal wiring and an output signal terminal, the other one being connected to an output side ground conductive pattern including an output side ground wiring and an output side ground terminal. At least one of the input side and output side ground conductive patterns is extended facing to both the input side and output side signal conductive patterns to form capacitance.

In the present surface acoustic wave element, between at least one of the input side and output side ground conductive patterns on the piezoelectric substrate and both the input side and output side signal conductive patterns, capacitances are formed to couple. The other ground conductive pattern, if it is an input side, may be formed to have capacitance with the output side signal conductive pattern, and if an output side, may be formed to have capacitance with the input side signal conductive pattern.

For the two-port surface acoustic wave resonator filter of the present surface acoustic wave element, a longitudinal mode coupled type surface acoustic wave resonator filter having three or more IDTs may be used.

That is, in the present surface acoustic wave element, at least one of ground conductive patterns including wiring and ground terminal connected to the interdigital electrodes of the IDT constituting the two-port surface acoustic wave resonator filter and both input and output signal terminals of the two-port surface acoustic wave resonator filter are disposed to couple through capacitances.

By adopting such a configuration, a resonant system having a trap in a frequency band apart from a pass band of the filter, for instance in a frequency band separated by several hundreds MHz, can be added. Accordingly, even when a surface acoustic wave element is flip-chip connected on for instance an envelope to mount, characteristics out of band can be improved and an adjustment of characteristics in conformity with a communication system can be implemented.

The capacitances between at least one of the input side and output side ground conductive patterns of the two-port surface acoustic wave resonator filter and both the input and output signal terminals can be formed by the following means.

These capacitances may be formed by disposing for instance the ground conductive pattern so as to face the input/output conductive patterns. Alternately, these may be formed due to comb-shaped capacitive electrodes. Further, on the piezoelectric substrate, a plurality of conductor layers may be disposed to face to each other through layers of dielectrics.

That is, in the surface acoustic wave element of the present invention, at least one of the input side and output side ground conductive patterns of the two-port surface acoustic wave resonator filter comprises at least one of an input capacitance formation conductive pattern and an output capacitance formation conductive pattern. The input capacitance formation conductive pattern is part of the ground conductive pattern and is extended facing to the input side signal conductive pattern and the input side signal conductive pattern. The output capacitance formation conductive pattern is part of the ground conductive pattern and is extended facing to the output side signal conductive pattern and the output side signal conductive pattern. Here, at least one of capacitances between the ground conductive pattern and the input side signal conductive pattern and between the ground conductive pattern and the output side signal conductive pattern can be formed between the signal conductive pattern and the capacitance formation conductive pattern extended facing to the output side signal conductive pattern.

In the surface acoustic wave element of the configuration, from at least one of ground terminals thereof, conductive pattern is connected on the piezoelectric substrate, and the conductive pattern, by disposing close to both wiring patterns connected to the input signal terminal of the two-port surface acoustic wave resonator filter and a wiring pattern connected to the output signal terminal, forms electric capacity therebetween. More specifically, the ground conductive pattern is routed (extended) approximately in parallel with the routing portions of the input/output side signal conductive patterns each, thereby a desired capacitance being formed.

Further, in the present surface acoustic wave element, at least one of the input side and output side ground conductive patterns of the two-port surface acoustic wave resonator filter comprises comb-shaped capacitive electrode for at least one of with the input side signal conductive pattern and with the output side signal conductive pattern, at least one of capacitances between the ground conductive pattern and the input side signal conductive pattern and between the ground conductive pattern and the output side signal conductive pattern being able to form by the comb-shaped capacitive electrodes.

In the configuration, due to the comb-shaped capacitive electrodes, between the ground electrode side of the two-port surface acoustic wave resonator filter and the input/output of the two-port surface acoustic wave resonator filter, electric capacity is formed.

When using the configuration, so that the comb-shaped capacitive electrodes do not excite surface acoustic waves to disturb signals, a pitch of the comb-shaped electrode and a direction of the comb-shaped pattern can be selected.

According to the configuration, compared with the case of forming capacitance due to a conductor pattern, the capacitance can be formed in a smaller area and a magnitude of added capacitance can be easily adjusted.

In the surface acoustic wave element of the present invention, at least on one ground conductive pattern of the two-port surface acoustic wave resonator filter a layer of dielectrics is formed, thereon at least one capacitance formation conductive pattern connected to the input side signal and output side signal conductive patterns being formed through the layer of dielectrics facing to the ground conductive pattern, at least one of capacitances between the ground conductive pattern and the input side signal conductive pattern and between the ground conductive pattern and the output side signal conductive pattern being able to form from the ground conductive pattern and the capacitance formation conductive pattern formed on the layer of dielectrics.

In the configuration, by interposing the layer of dielectrics between a plurality of conductor layers, between the ground terminal of the two-port surface acoustic wave resonator filter and the input and output signal terminals of the two-port surface acoustic wave resonator filter, capacitances are formed.

Due to strong demand for miniaturizing a surface acoustic wave element, an improvement of degree of freedom in designing is a serious concern. According to the aforementioned configuration, a magnitude of the capacitance to be formed can be adjusted with a larger degree of freedom, an adjustment of the position of the trap or the like being easily implemented.

Other than these, by disposing a conductor layer for instance on the envelope thereon a surface acoustic wave element is mounted in face down bonding, between the conductor layer and input/output IDT electrodes of the two-port surface acoustic wave resonator filter, capacitance may be formed.

Next, a surface acoustic wave device of the present invention is one formed by flip-chip assembling the aforementioned surface acoustic wave element of the present invention on a package called envelope due to face down bonding.

A surface acoustic wave device of the present invention comprises a piezoelectric substrate, a surface acoustic wave element disposed on the piezoelectric substrate and having a two-port surface acoustic wave resonator filter having input and output IDTs, a printed circuit board and a conductive bump. In the surface acoustic wave element, one of a pair of interdigital electrodes constituting the input IDT is connected to an output side signal conductive pattern including an input side signal wiring and an input signal terminal. The other one is connected to an input side ground conductive pattern including an input side ground wiring and an input side ground terminal. One of a pair of interdigital electrodes constituting the output IDT is wired to the output side signal conductive pattern including the output side signal wiring and the output signal terminal. The other one is connected to the output side ground conductive pattern including the output side ground wiring and the output side ground terminal. At least one of the input side and output side ground conductive patterns is extended facing to both the input side and output side signal conductive patterns and forms capacitance. The printed circuit board comprises an area thereon the surface acoustic wave element is mounted and terminals corresponding to an input signal terminal, an output signal terminal and a ground terminal of the surface acoustic wave element. The conductive bump connects the input signal terminal, the output signal terminal and the ground terminal of the surface acoustic wave element and the terminals of the printed circuit board.

In the surface acoustic wave element, at least one of the input side and output side ground conductive patterns comprises at least one of an input capacitance formation conductive pattern and an output capacitance formation conductive pattern. The input capacitance formation conductive pattern is part of the ground conductive pattern and is extended facing to the input side signal conductive pattern and the input side signal conductive pattern. The output capacitance formation conductive pattern is part of the ground conductive pattern and is extended facing to the output side signal conductive pattern and the output side signal conductive pattern. Capacitance between the ground conductive pattern and the input side signal conductive pattern and capacitance between the ground conductive pattern and the output side signal conductive pattern may be formed between the signal conductive pattern and the capacitance formation conductive pattern extended facing to the signal conductive pattern. Further, these capacitances of the surface acoustic wave element may be formed of the comb-shaped electrodes or may be formed due to conductor patterns facing through a layer of dielectrics.

For the printed circuit board, a printed wiring board such as for instance a ceramic substrate can be used. By adopting such configuration, the present surface acoustic wave device, while realizing miniaturization of a package due to the flip-chip assembling, without using bonding wire, can improve characteristics out of pass band of the filter, that is, can add a resonant system having a trap in a frequency band for instance several hundreds MHz apart from a pass band. Accordingly, a surface acoustic wave device small in size and excellent in frequency characteristics, particularly suitable for mobile communication instruments, can be realized.

A surface acoustic wave element of the present invention comprises a piezoelectric substrate, a first conductor layer disposed on the piezoelectric substrate, a layer of dielectrics and a second conductor layer. The layer of dielectrics is formed laminated on at least part of the first conductor layer. The second conductor layer is laminated through at least part of the layer of dielectrics in at least part of the area of the first conductor layer.

That is, in the surface acoustic wave element of the present invention, on the first conductor layer disposed on the piezoelectric substrate, through the layer of dielectrics the second conductor layer is disposed to form a capacitance element. The first and second conductor layers are formed in the patterns of for instance surface acoustic wave filter, surface acoustic wave resonator, surface acoustic wave resonator filter, routing electrode or the like. Thereby, a resonant system can be added so as to have a trap in a band different from a pass band of a filter formed in an element.

According to the present invention, without making use of the inductance of the bonding wire as before, a surface acoustic wave element can be assembled due to flip-chip assembling to miniaturize and a trap can be simultaneously formed in a frequency band several hundreds MHz apart from the pass band.

In the present invention, the layer of dielectrics, without restricting to a single layer structure of one dielectrics, can be formed in a mixed layer of a first dielectrics of first permittivity and a second dielectrics of second permittivity or may be formed in a laminate structure thereof. Alternately, three or more kinds of dielectrics of different permittivities may be mixed or laminated to use. Thereby, the magnitude of capacitance being added can be further easily adjusted.

As the dielectrics being used in the present invention, various kinds of dielectrics including for instance silicon oxide ($SiO_x$), silicon nitride ($SiN_x$), silicon oxynitride (SiON) can be used.

In flip-chip assembling, after a conductive bump such as gold bump or the like is disposed on a pad for connection disposed on the piezoelectric substrate, between the bump and the corresponding pad on the printed circuit board, heat, pressure, ultrasonics or the like is inputted to form a solid diffusion layer and to connect. As a result, onto the pad, during connection, large stress is applied. Accordingly, it is preferable to thicken a conductor of the pad portion to strengthen mechanical strength.

In laminating a plurality of conductor layers through layer of dielectrics to form a capacitance element on the piezoelectric substrate, by penetrating the layer of dielectrics to interlayer-connect the first and second conductor layers, reliability of connection with the external due to the conductive bump can be further improved.

Thus, the present surface acoustic wave element may comprise a piezoelectric substrate, a first conductor layer disposed on the piezoelectric substrate, a second conductor layer laminated through at least part of the area of the first conductor layer and a layer of dielectrics, and means for interlayer connecting the first and second conductor layers penetrated through the layer of dielectrics.

On the second conductor layer, a conductive bump may be disposed. Of course, the surface acoustic wave element can be bonding assembled, even in that case reliability in connection being able to improve.

In the surface acoustic wave element and the surface acoustic wave device of the present invention, thus, in the surface acoustic wave element, or between the surface acoustic wave element and the envelope, capacitance can be formed. Due to the capacitance formation, another resonant system different from the resonant system of surface acoustic waves can be added.

Even when the flip-chip assembling is used in assembling the surface acoustic wave element to miniaturize and there is not relatively large inductance due to the wire as in the case of the existing wire bonding, a resonant system can be added, that is a position of a trap can be adjusted at a frequency band for instance several hundreds MHz apart from a pass band. Accordingly, due to the present invention, a surface acoustic wave element and a surface acoustic wave device that are small in size and excellent in attenuation characteristics out of band can be provided.

BRIEF DESCRIPTION OF THE DRAWINGS

FIG. 14 is a diagram schematically showing one embodiment of a surface acoustic wave device of the present invention.

BEST MODES FOR IMPLEMENTING THE INVENTION

In the following, the present invention will be described in more detail.

(Embodiment 1)

Figure 1:
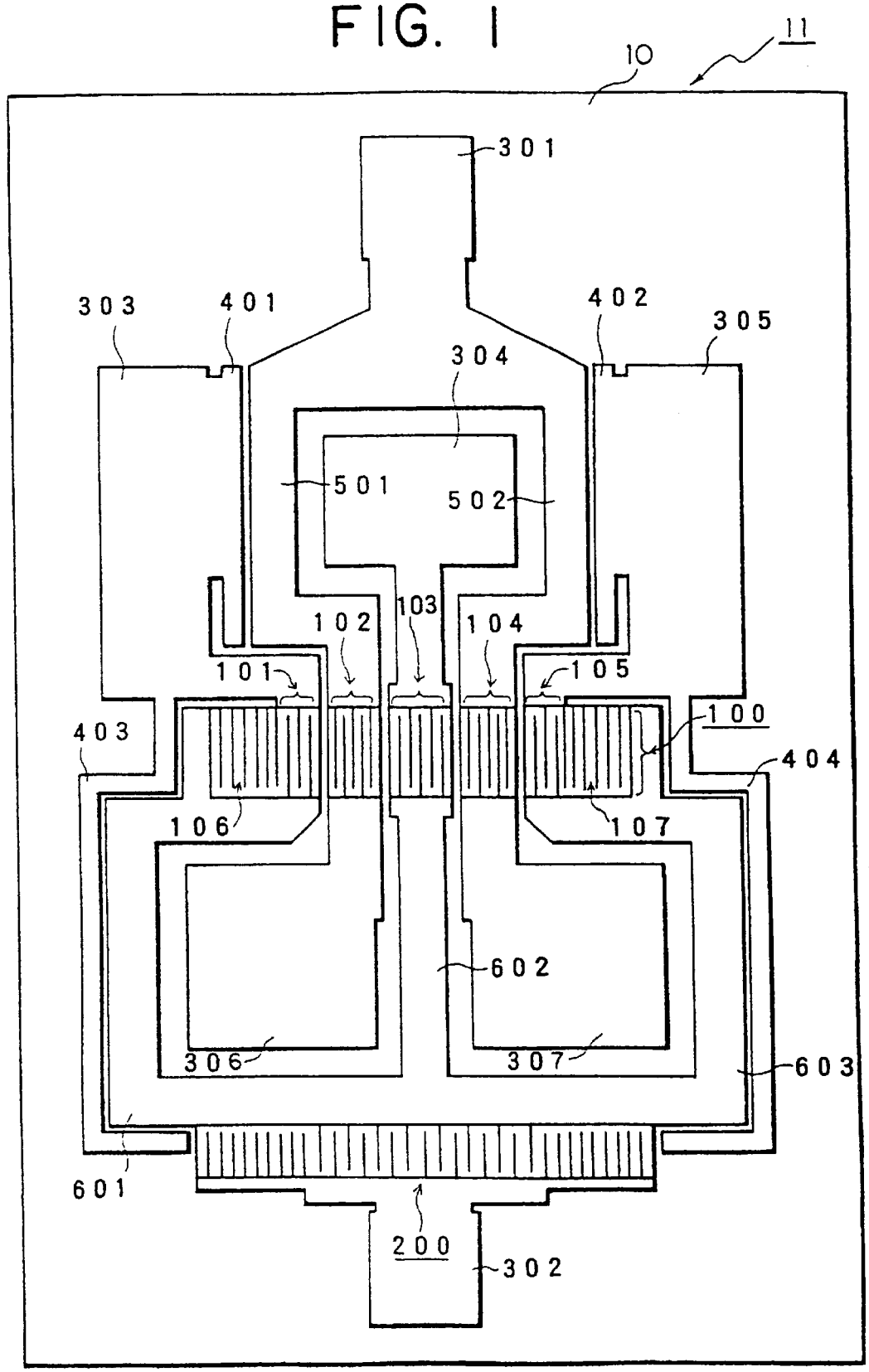
FIG. 1 is a diagram schematically showing one embodiment of a surface acoustic wave element of the present invention.

FIG. 1 is a diagram schematically showing one embodiment of a surface acoustic wave element of the present invention.

In the surface acoustic wave element 11, on a piezoelectric substrate 10, a two-port surface acoustic wave resonator filter 100 and a one-port surface acoustic wave resonator 200 are disposed, thereby as a whole constituting a surface acoustic wave filter. The two-port surface acoustic wave resonator filter 100 has five IDTs 101, 102, 103, 104 and 105 each consisting of five pairs of interdigital electrodes. The one-port surface acoustic wave resonator 200 is connected in series arm to the two-port surface acoustic wave resonator filter. Reference numerals 106 and 107 denote reflectors.

In two input IDTs 102 and 104 of the two-port surface acoustic wave resonator filter, one side interdigital electrodes constituting the IDT are connected with an input signal terminal 301, the other side interdigital electrodes are connected to input side ground terminals 306 and 307. In the remaining three output IDTs 101, 103 and 105, one side interdigital electrodes are connected to output side ground terminals 303, 304 and 305 respectively, the other side interdigital electrodes having wiring patterns 601, 602 and 603 as an output signal terminal of the two-port surface acoustic wave resonator filter. The output signal terminal is connected to the one-port surface acoustic wave resonator 200 connected in series arm to the two-port surface acoustic wave filter. These of the input signal terminal 301, the output signal terminal 302 of the element, the ground terminals 303, 304, 305, 306 and 307 can be connected to corresponding terminals of the envelope through for instance conductive bump.

In the present surface acoustic wave element, at least one of the ground terminals wired to the interdigital electrodes constituting the input IDTs 102 and 104 and the output IDTs 101, 103 and 105 is disposed to have capacitances with an input signal terminal wired to the input IDT and with an output signal terminal of the two-port surface acoustic wave filter wired to the output IDT.

That is, in the present surface acoustic wave element, at least one of the ground conductive patterns including the wiring and the ground terminals all of which are connected to the interdigital electrodes of the IDTs constituting the two-port surface acoustic wave resonator filter is disposed to have coupling with both the input and output signal terminals of the two-port surface acoustic wave resonator filter by capacitance.

Due to the resonant system that uses the capacitances, a trap can be formed in a band apart from the pass band of the surface acoustic wave element, the frequency characteristics being able to adjust with flexibility in conformity with system requirement of a communication system.

Among three output IDTs 101, 103 and 105 connected to an output side of the two-port surface acoustic wave resonator filter 100, from the output side ground terminals 303 and 305 connected to both end IDTs 101 and 105, Al patterns 401, 402, 403 and 404 that are capacitance formation conductive patterns are disposed elongated facing to and along the input side and output side wirings. These are extended on the piezoelectric substrate slightly separated from and in immediate vicinity of the routing wiring 501 and 502 of the input IDTs 102 and 104 and routing wiring 601 and 603 of the output IDTs respectively, being disposed oppositely, thereby therebetween electric capacity being formed.

The ground terminal 304 connected to the output IDT 103 is extended to face the input routing wirings 501 and 502 in the surroundings thereof, accordingly therebetween electric capacity being formed.

In the surroundings of the ground terminals 306 and 307 connected to the input side IDTs 102 and 104 too, the routing wirings 601, 602 and 603 from the output side IDTs are extended to face, accordingly therebetween electric capacity being formed.

Figure 2:
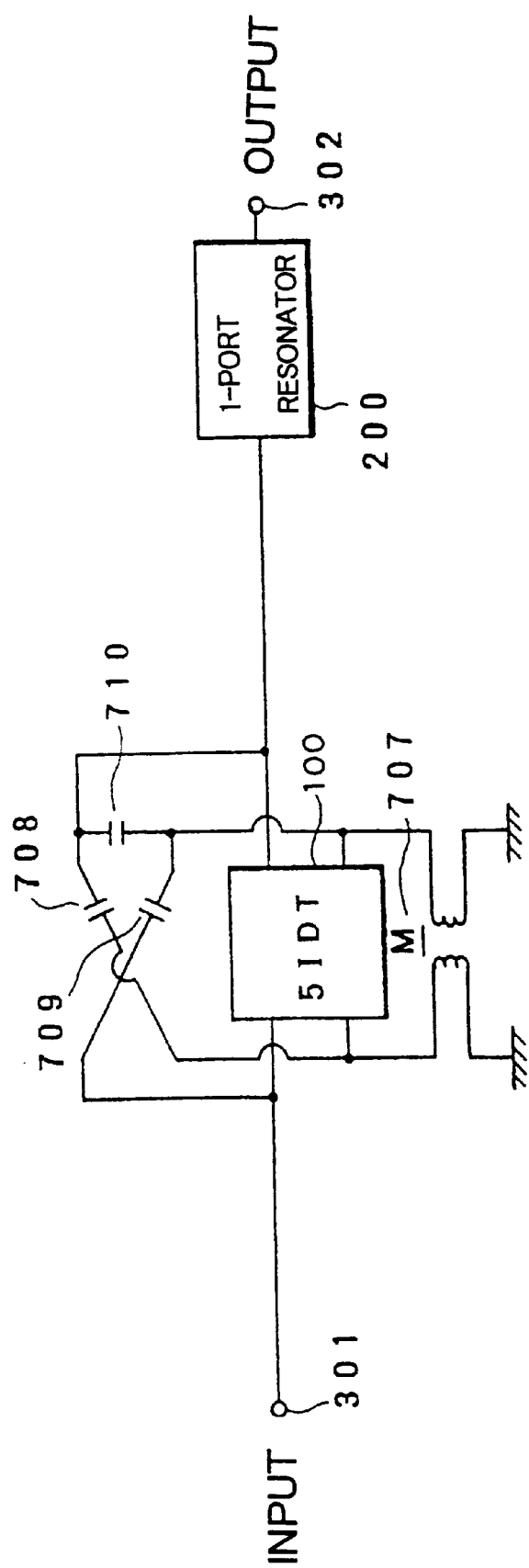
FIG. 2 is a diagram showing an equivalent circuit of one embodiment of a surface acoustic wave element of the present invention.

FIG. 2 is a diagram schematically showing an equivalent circuit of a surface acoustic wave element of the present invention illustrated in FIG. 1. Capacitances are shown together with the two-port surface acoustic wave resonator filter 100 and the one-port surface acoustic wave resonator 200.

A terminal connected to input/output ground potential has only small inductance of at most approximately 0.1 to 0.2 nH. Between input/output bumps takes a form of coupling due to negative mutual inductance, being shown by 707. Capacitances formed between the ground electrode side and the input/output signal sides of the two-port surface acoustic wave resonator filter 100 are shown by capacitances 708, 709 and 710.

The capacitance 708 corresponds to the capacitance formed between the ground terminals 306 and 307 and wirings 601, 602 and 603.

The capacitance 709 corresponds to the capacitance formed between the wirings 401 and 501, between the wiring 402 and the wiring 502, or between the ground terminal 304 and the wirings 501 and 502.

Further, the capacitance 710 corresponds to the capacitance between the wiring 403 and the wiring 601, and the wiring 404 and the wiring 603.

When the surface acoustic wave element illustrated in FIG. 1 is flip-chip assembled, the input signal terminal 301, the output signal terminal 302 and the ground terminals 303, 304, 305, 306 and 307 are connected to the corresponding terminals of the envelope due to the conductive bumps made of gold. The inductance due to these seven bumps is as small as approximately 0.2 nH or less.

Accordingly, it is difficult to make use of a trap by a parallel LC resonant system due to inductance of the bump and stray capacitance of the ground terminal for attenuation out of band.

However, in the surface acoustic wave element of the present invention, due to the existence of the capacitance 708, 709 and 710, a resonant system can be formed to dispose a trap out of band.

Figure 3:
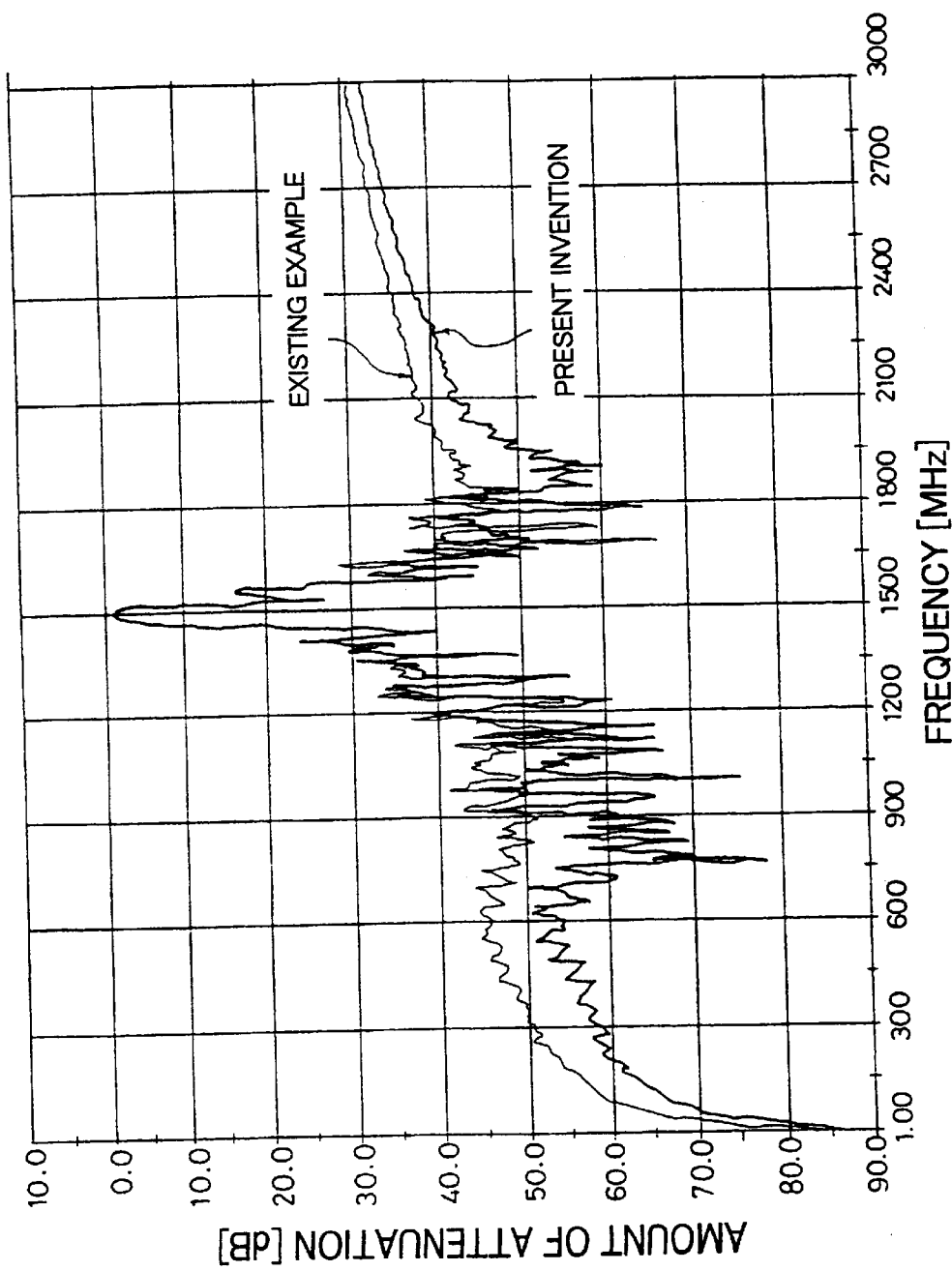
FIG. 3 is a diagram showing simulation results of frequency characteristics of one embodiment of a surface acoustic wave element of the present invention.

FIG. 3 is a diagram showing simulation results of frequency characteristics of the surface acoustic wave resonator filter in which the capacitances 708, 709 and 710 are added to one shown in FIGS. 1 and 2.

Figure 4:
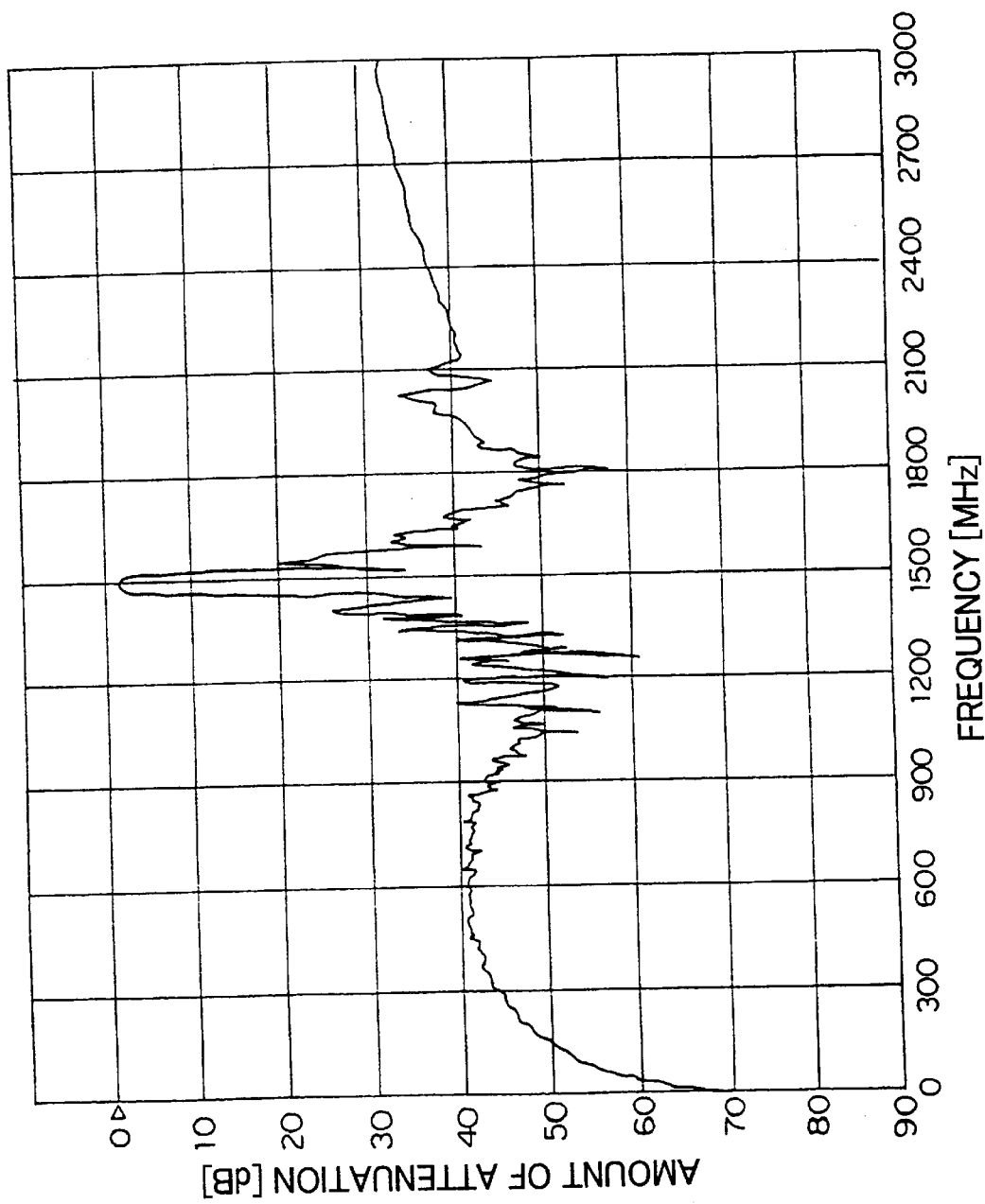
FIG. 4 is a diagram showing measurement results of frequency characteristics of one embodiment of a surface acoustic wave element of the present invention.
Figure 5:
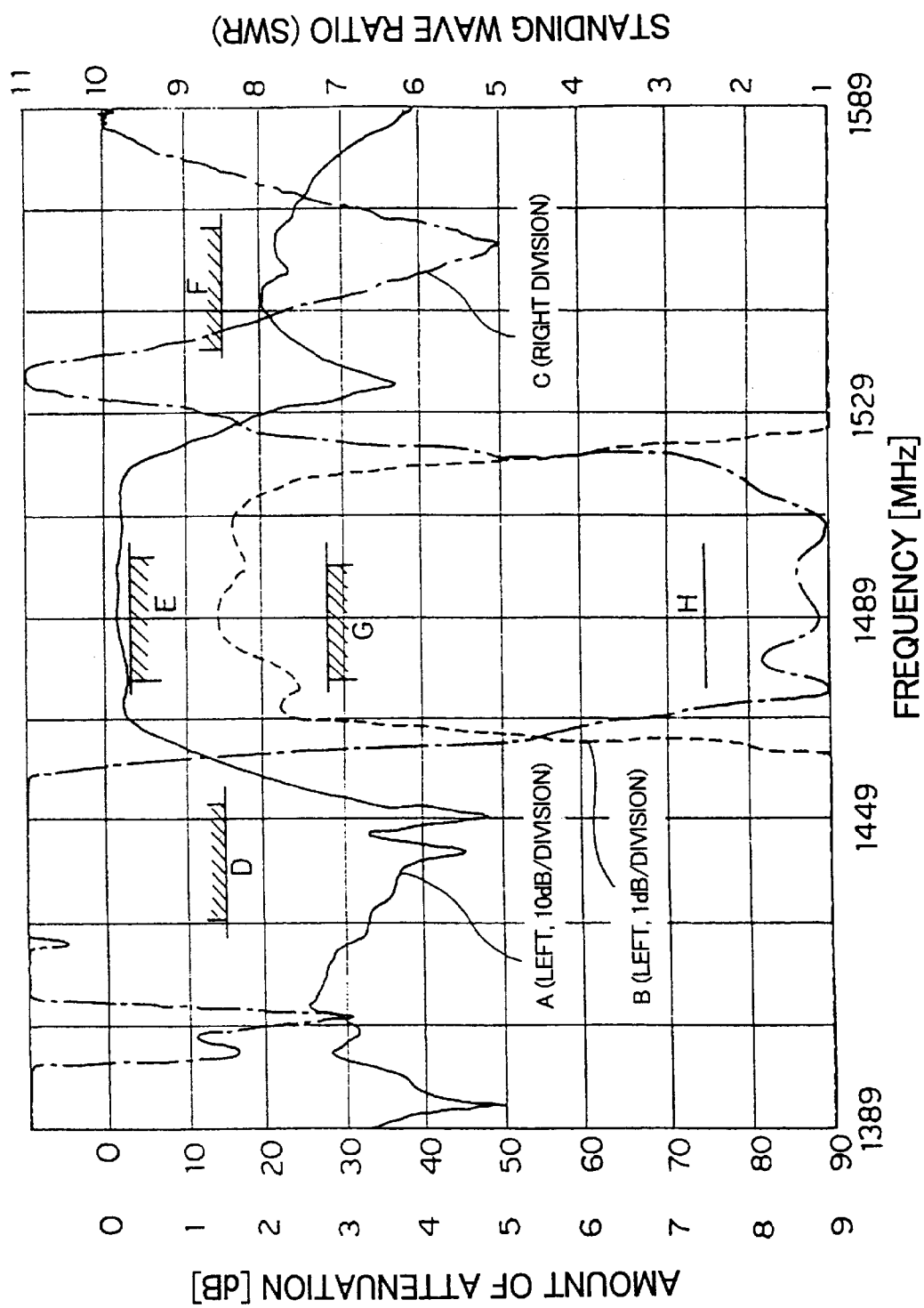
FIG. 5 is a diagram showing measurement results of frequency characteristics of one embodiment of a surface acoustic wave element of the present invention.

The surface acoustic wave element shown in FIG. 1 is actually manufactured and measured of frequency characteristics thereof. FIGS. 4 and 5 are diagrams showing measurement results thereof.

In FIG. 5, curve A shows the relationship between frequency and amount of attenuation of the surface acoustic wave filter in terms of 10 dB/division and curve B shows characteristics in the vicinity of the pass band thereof in term of 1 dB/division. Further, curve C shows reflection characteristics in terms of standing wave ratio. In the figure, D, E and F show specification for attenuation characteristics of A, G shows the same specification as E for B, further H shows a specification for standing wave ratio of C. In this example, all the specifications are satisfied.

Figure 6:
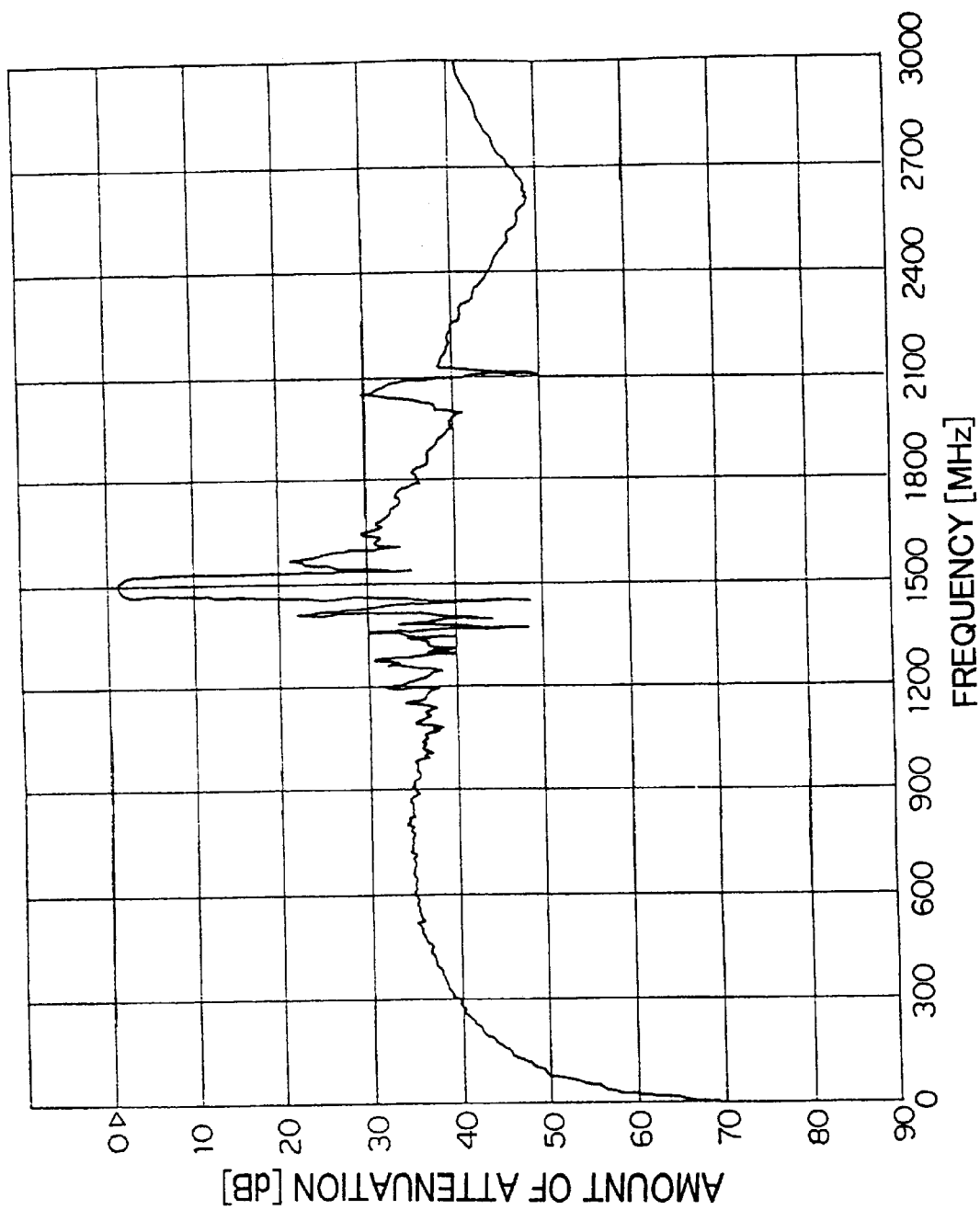
FIG. 6 is a diagram showing measurement results of frequency characteristics of one embodiment of a surface acoustic wave element of comparative example.
Figure 7:
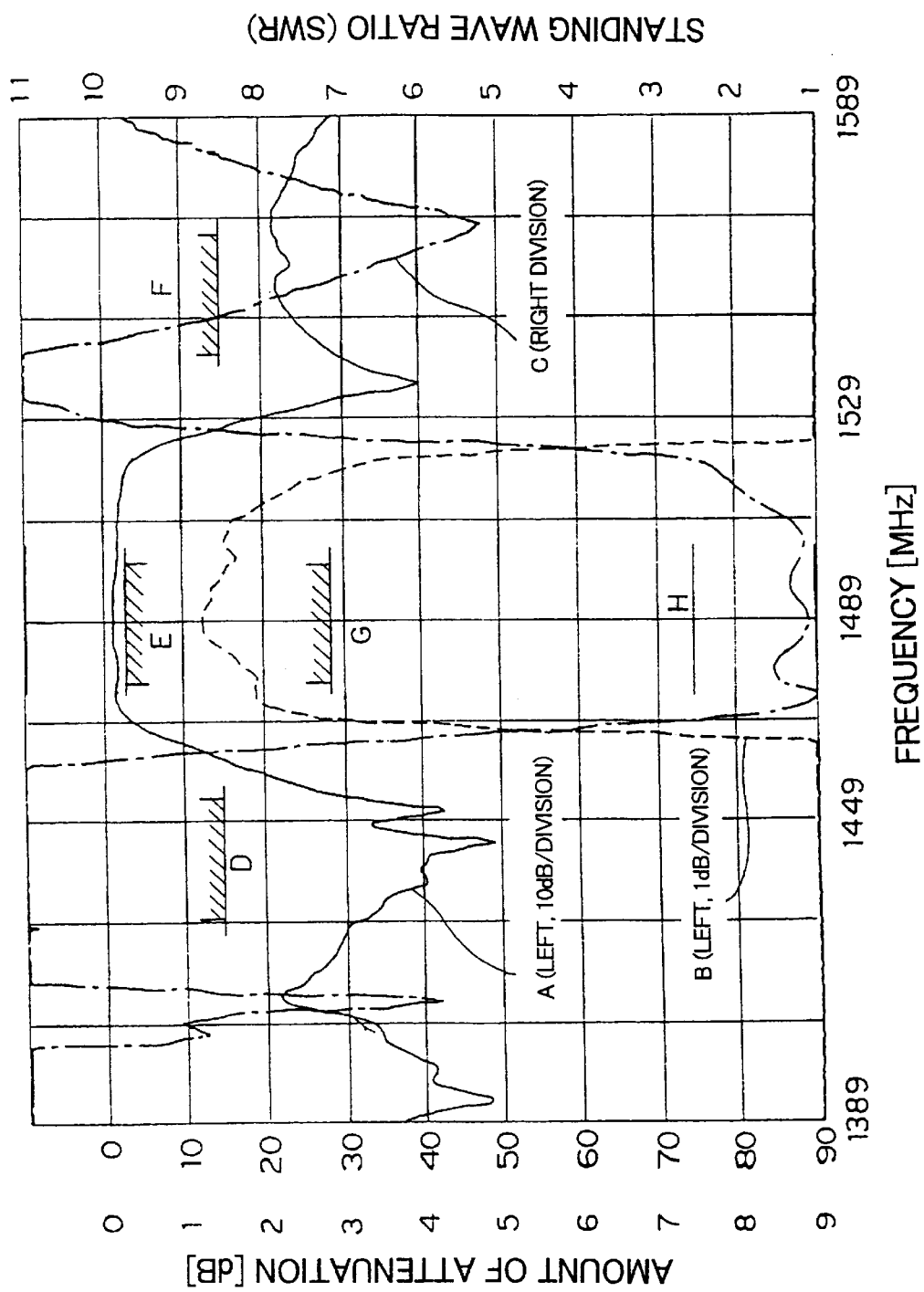
FIG. 7 is a diagram showing measurement results of frequency characteristics of one embodiment of a surface acoustic wave element of comparative example.

As a comparative example, for a case where the present invention is not applied, that is for the case where there is no substantial electric capacity between ground electrode side of the output side interdigital electrodes of the two-port surface acoustic wave resonator filter and both input and output sides of the two-port surface acoustic wave resonator filter, simulation results and actual measurements are shown together in FIG. 3. Actual measurement results of the frequency characteristics are shown in FIGS. 6 and 7. Marks A to H in FIG. 7 are identical with those in FIG. 5.

From these figures, in the surface acoustic wave filter of the present invention, at several hundreds MHz higher side from a pass band around 1500 MHz, an amount of attenuation is found to be largely increased.

In the present embodiment and comparative example, both surface acoustic wave elements are flip-chip assembled. That is, a chip in which the pattern of the surface acoustic wave filter is formed on the piezoelectric substrate, after forming Au bumps at positions necessary of electrical communication between the chip and the printed circuit board and at positions necessary for fixing the chip, is disposed to face to a printed circuit board, followed by inputting ultrasonics under heating and pressurizing to connect. After thus bonding the chip on the printed circuit board, a cap is put on the printed circuit board to seal.

Thus, according to the present invention, different from the existing surface acoustic wave element, even for a surface acoustic wave element mounted due to the flip-chip assembling in which bonding wire having inductance is not used, a frequency band high of amount of attenuation can be set around a position several hundreds MHz apart from the pass band. Accordingly, a surface acoustic wave element filter in which a high amount of attenuation can be obtained in a band of local oscillation frequency or image frequency can be obtained.

(Embodiment 2)

Figure 8:
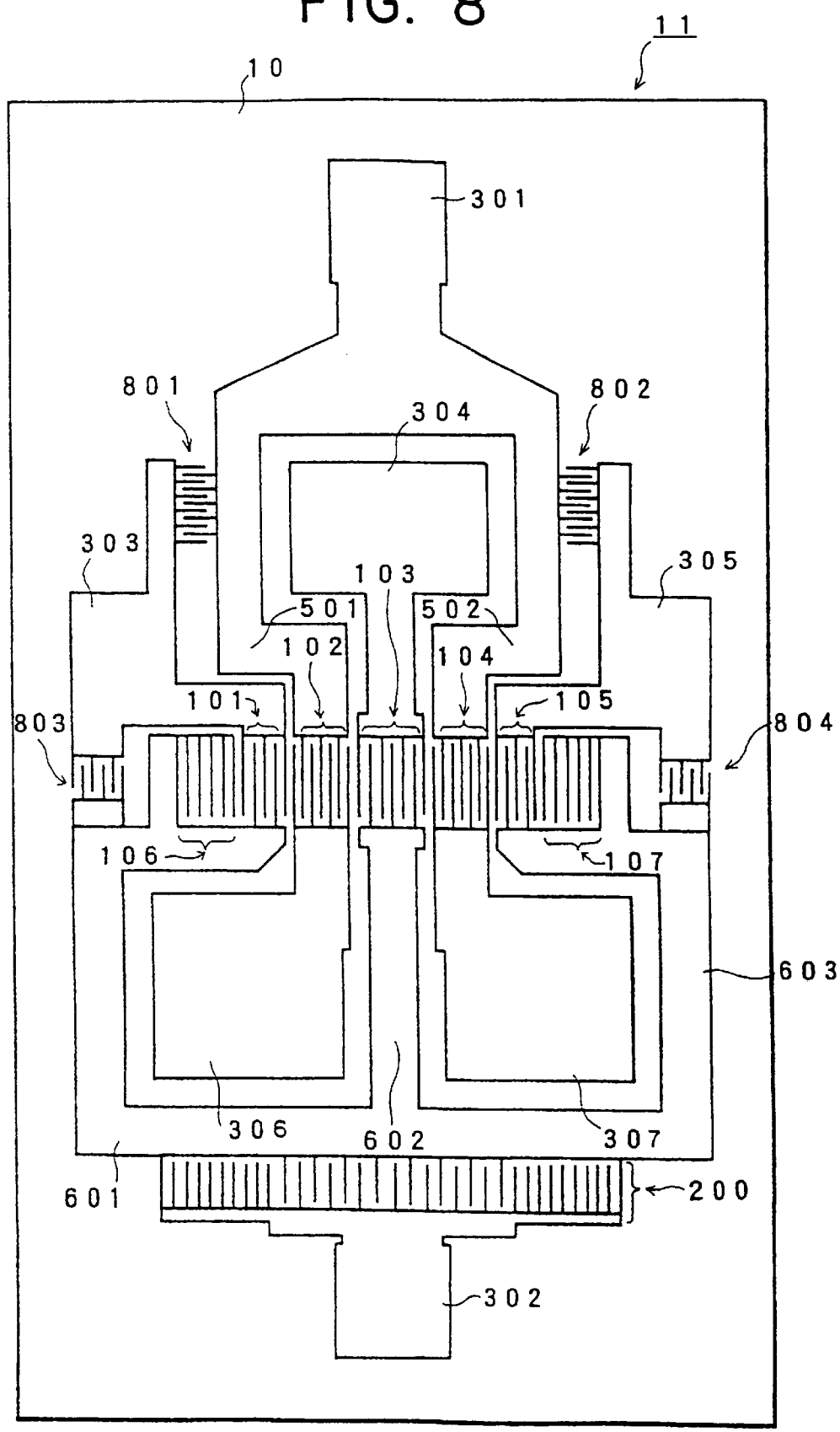
FIG. 8 is a diagram schematically showing another embodiment of a surface acoustic wave element of the present invention.

FIG. 8 is a diagram schematically showing another embodiment of a surface acoustic wave element of the present invention.

In this embodiment, capacitance between the wiring from an output IDT constituting a two-port surface acoustic wave resonator filter to a ground terminal and the wiring from an input signal terminal to input IDTs 102 and 104, and capacitance between the wiring from output IDTs 101 and 105 constituting the two-port surface acoustic wave resonator filter to the ground terminal and the wiring from the output IDT to an output signal terminal are formed of comb-shaped capacitive electrodes 801 and 802, and 803 and 804, respectively.

According to the configuration like this, electric capacity can be formed in a relatively small area. Accordingly, a degree of freedom of design can be improved. Further, in conformity with the system requirement, a more appropriate trap can be formed.

(Embodiment 3)

Figure 9:
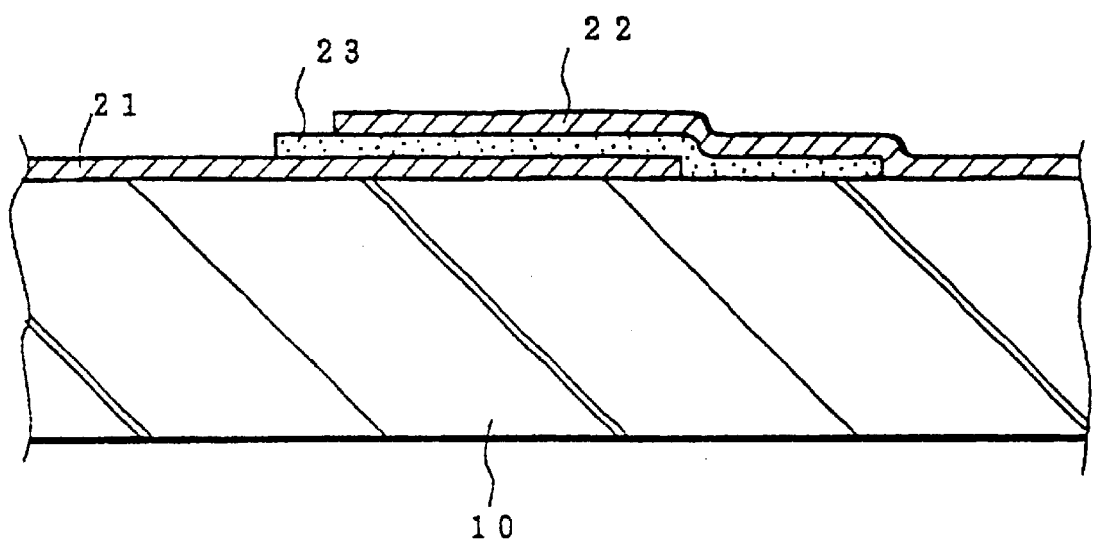
FIG. 9 is a diagram schematically showing still another embodiment of a surface acoustic wave element of the present invention.
Figure 10:
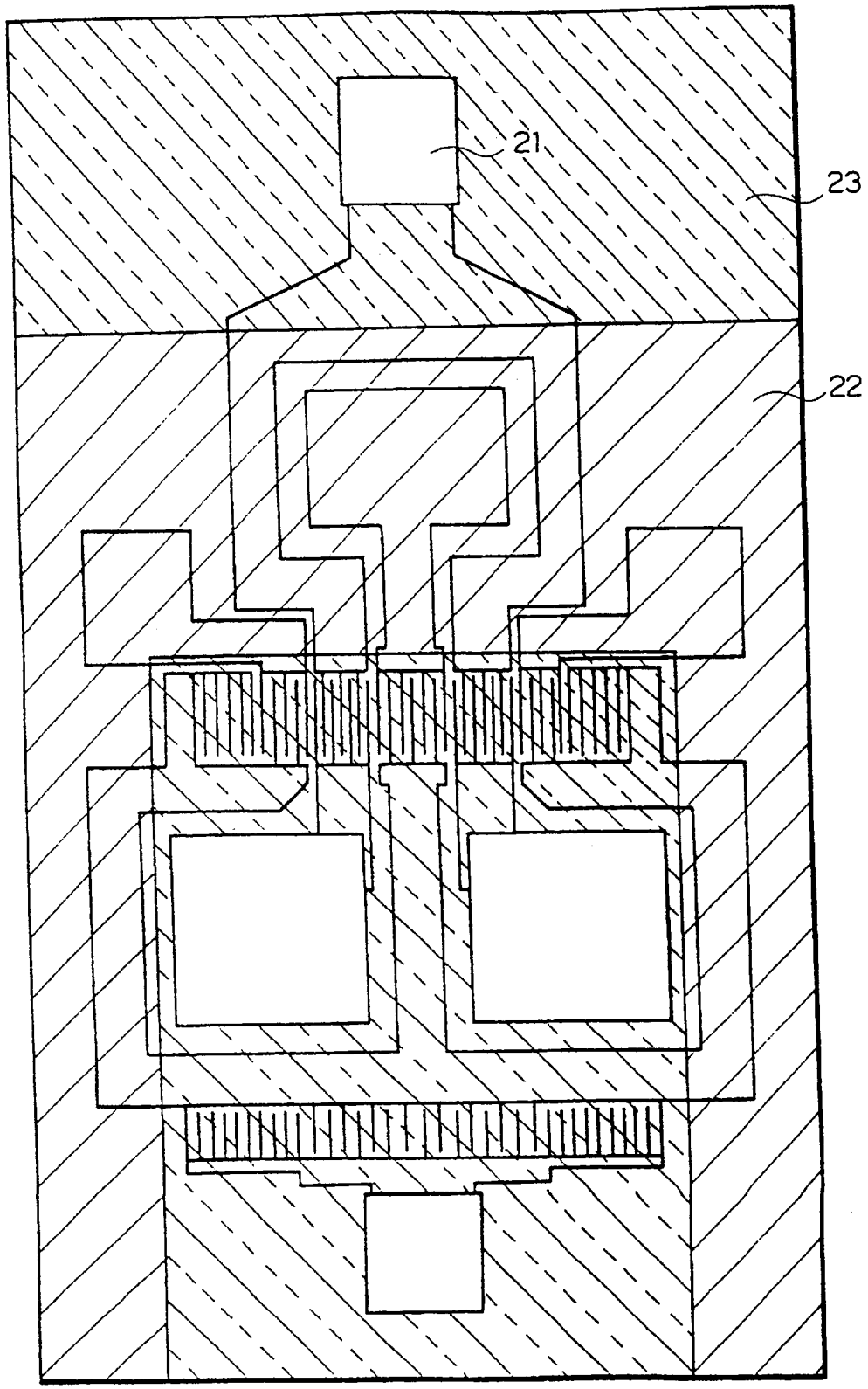
FIG. 10 is a diagram for explaining an example of a configuration of a surface acoustic wave element of the present invention.

FIGS. 9 and 10 are diagrams schematically showing still another embodiment of a surface acoustic wave element of the present invention, FIG. 10 being a schematic plan view, FIG. 9 being a schematic enlargement of part of a section thereof.

As shown in FIG. 9, the surface acoustic wave element has a portion where a layer of dielectrics 23 is interposed between a first conductor layer 21 and a second conductor layer 22 disposed on a piezoelectric substrate 10.

As shown in FIG. 10, the first conductor layer 21 and the second conductor layer 22 each are patterned into IDT, reflector, input/output signal terminals, ground terminal and wiring connecting therebetween. By adopting such a configuration, capacitance elements can be formed in the surface acoustic wave element. Accordingly, by adding a resonant system due to the capacitance element, frequency characteristics of the filter or the like formed on the piezoelectric substrate can be adjusted.

Figure 11:
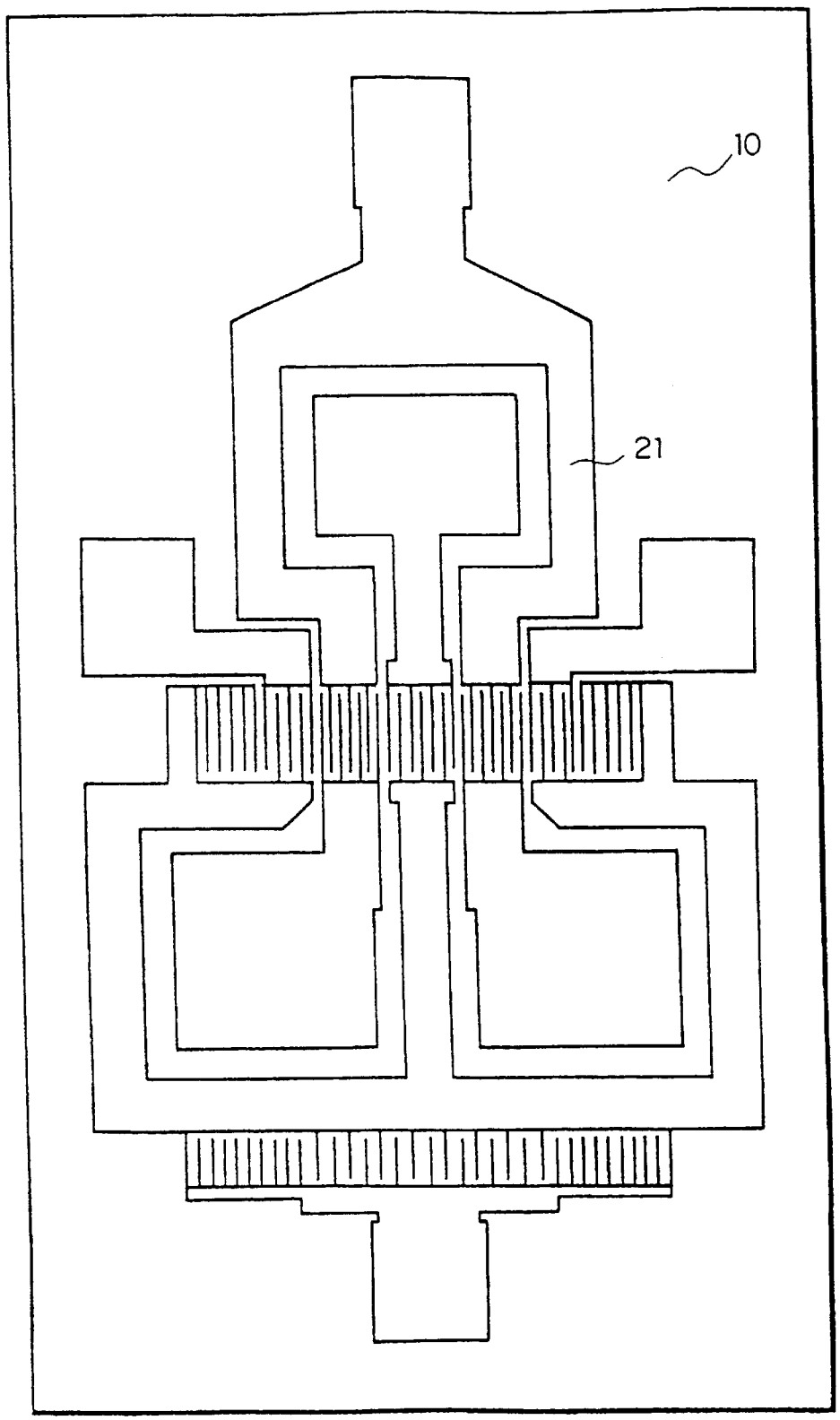
FIG. 11 is a diagram for explaining a method for manufacturing a surface acoustic wave element of one embodiment of the present invention.
Figure 12:
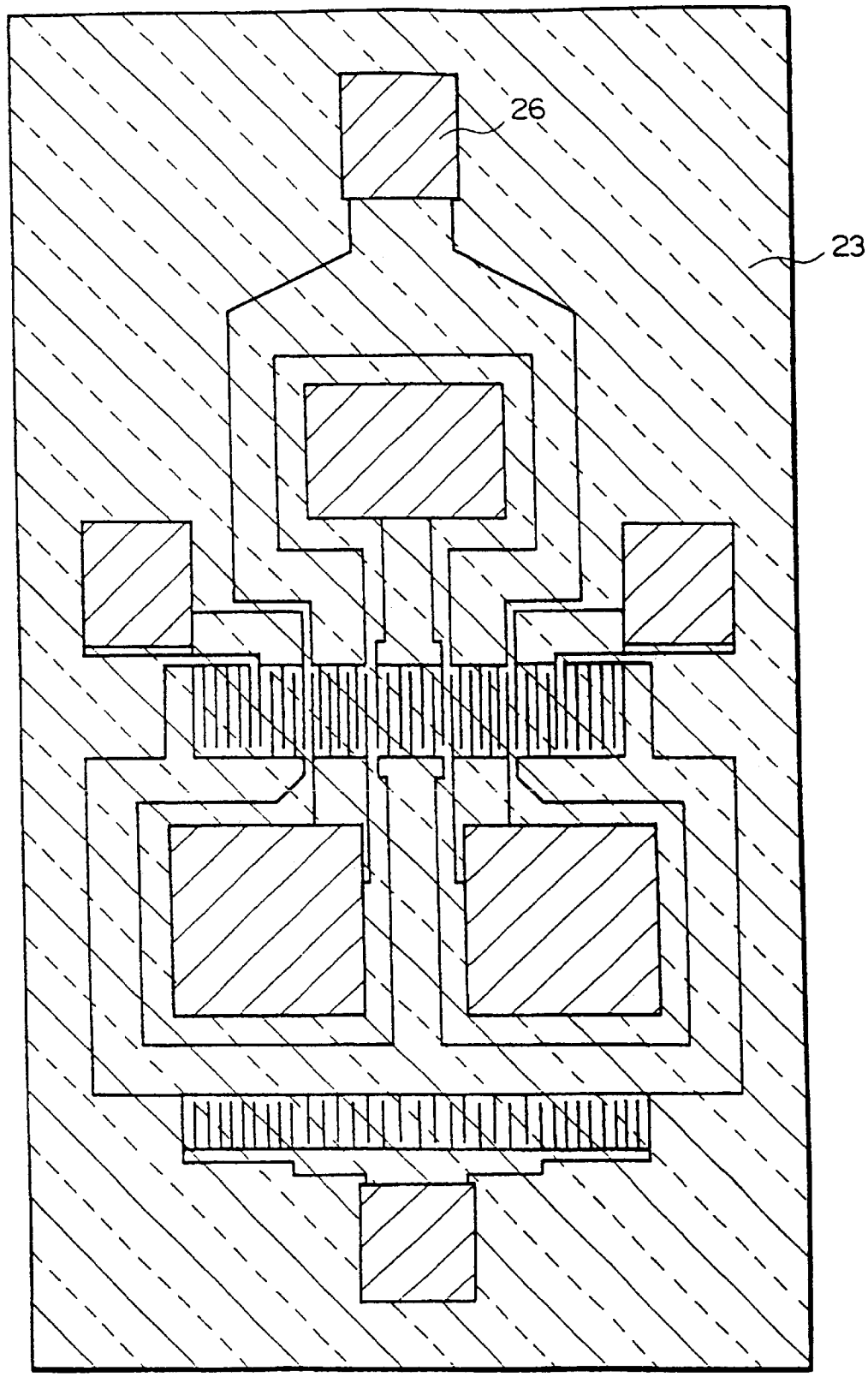
FIG. 12 is a diagram for explaining a method for manufacturing a surface acoustic wave element of one embodiment of the present invention.

FIGS. 11 and 12 are diagrams schematically showing procedure for manufacturing the surface acoustic wave element of the present embodiment having the configuration shown in FIGS. 9 and 10. Here, an electric capacity between two ground terminals wired to the output IDT of the two-port surface acoustic wave resonator filter and input signal and output signal routing wirings of the two-port surface acoustic wave resonator filter is formed by interposing a layer of dielectrics between the first conductor layer 21 and the second conductor layer 22.

First, as shown in FIG. 11, on the piezoelectric substrate, the first conductor layer 21 that is the most lowly lying layer is deposited and patterned. Thereafter, the layer of dielectrics 23 is deposited in film and due to CDE (Chemical Dry Etching), in ground terminal portions of the interdigital electrodes of the two-port surface acoustic wave resonator filter portion, windows 26 are opened in areas shown by slashes in FIG. 12. Further, the second conductor layer 22 is deposited in film and patterned to form, as shown by slashed portion in FIG. 10, covering on the input and output routing wirings. Thereby, the ground side electrode and input/output portions are connected through electric capacities respectively as shown in FIG. 9.

(Embodiment 4)

Figure 13:
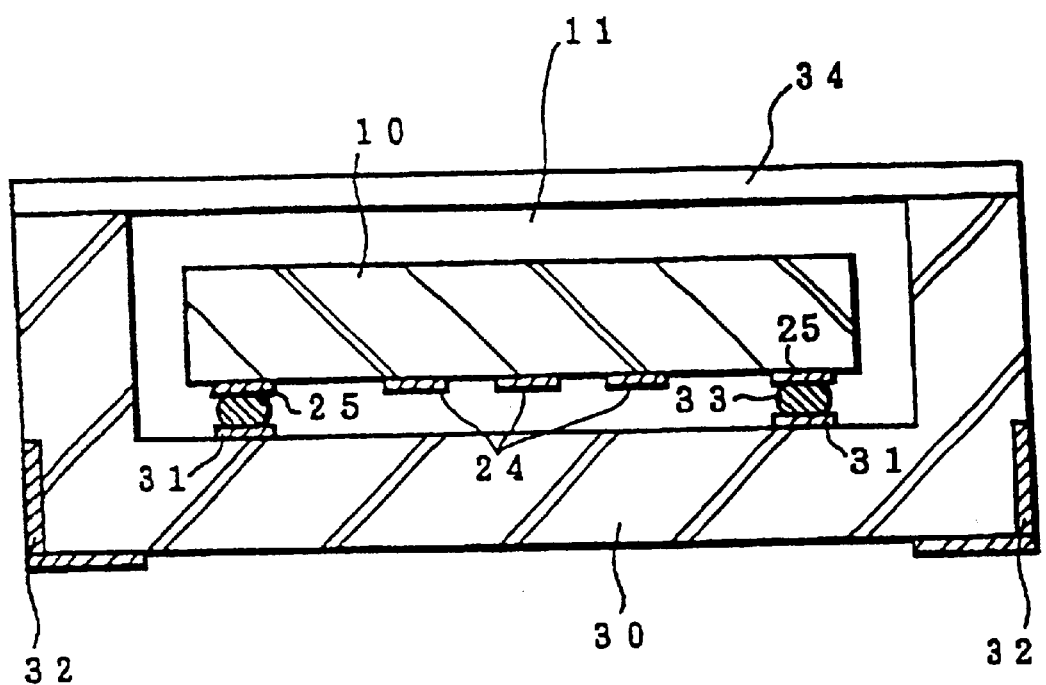
FIG. 13 is a diagram schematically showing one embodiment of a surface acoustic wave device of the present invention.

FIG. 13 is a diagram schematically showing one embodiment of a surface acoustic wave device of the present invention.

In the surface acoustic wave device, a surface acoustic element 11 having an electrode pattern 24 of IDTs or the like is mounted in a face down manner into a ceramic package 30, followed by encapsulation with a metal cap 34. The electrode pattern 24, as shown in the aforementioned embodiment, is constituted so that at least one ground side interdigital electrode of the IDTs constituting the surface acoustic wave resonator filter has capacitances between both the input signal terminal side wired to the input IDTs of the two-port surface acoustic wave filter and the output signal terminal side wired to the output IDTs.

A connection terminal 25 of the surface acoustic wave element 11 and a connection terminal 31 disposed on a package 30 are connected due to a conductive bump 33 made of such as Au. The connection terminal is connected to an external connection terminal 32 disposed outside the package 30, therethrough electrical connection between the surface acoustic wave element and the external being implemented.

FIG. 14 is a schematic diagram of another example of the configuration of a surface acoustic wave element of the present invention. In the figure, the connecting portion between the surface acoustic wave device 11 and the package 30 is enlarged to show.

The connection terminal 25 of the surface acoustic wave element 11 is constituted of a first conductor layer 21, a layer of dielectrics 23 disposed on the first conductor layer and a second conductor layer 22 disposed on the layer of dielectrics 23. The second conductor layer 22 is electrically connected with the first conductor layer 21 through an opening disposed through the layer of dielectrics 23.

In this example, the interlayer connection between the first and second conductor layers is formed of the second conductor layer. However, other means can be used for the interlayer connection.

The conductive bump 33 is disposed on the second conductor layer 22, through the conductive bump electrical and mechanical connections with the connection terminal 31 that is part of the wiring pattern disposed on the package 30 being implemented.

In the present invention, mechanical strength of the connection terminal 25 portion can be increased, thereby reliability of the connection between the surface acoustic wave element 11 and the package 30 can be improved.

Industrial Applicability

As explained above, according to the present invention, a surface acoustic wave element can be flip-chip assembled to miniaturize an element and a device, and to improve attenuation characteristics out of band. Thereby, the attenuation characteristics out of band conformed to a system to be used can be obtained, a surface acoustic wave filter having high attenuation characteristics even in a frequency band apart for instance several hundreds MHz from the pass band can be constituted. In addition, according to the present invention, connection reliability of the element also can be improved.

Accordingly, due to the present invention, a surface acoustic wave element and a surface acoustic wave device of small size, excellent attenuation characteristics and excellent reliability, which have broad applications in for instance such as mobile communication can be provided.

What is claimed is:

1. A surface acoustic wave element, comprising:
   a piezoelectric substrate; and
   a two-port surface acoustic wave resonator filter disposed on the piezoelectric substrate and having an input IDT and an output IDT;

wherein one of a pair of interdigital electrodes constituting the input IDT is connected to an input side signal conductive pattern including an input side signal wiring and an input signal terminal, the other one being connected to an input side ground conductive pattern including an input side ground wiring and an input side ground terminal;

one of a pair of interdigital electrodes constituting the output IDT is connected to an output side signal conductive pattern including an output side signal wiring and an output signal terminal, the other one being connected to an output side ground conductive pattern including an output side ground wiring, and an output side ground terminal; and at least one of the input side and output side ground conductive patterns is extended facing to both the input side and output side signal conductive patterns to form capacitance.

2. The surface acoustic wave element as set forth in claim 1;

wherein one of the input side and output side ground conductive patterns forms capacitances with both the input side and output side signal conductive patterns, the other one of the ground conductive patterns forming capacitance with, of the input side and output side signal conductive patterns, the signal conductive pattern on the opposite side from the ground conductive pattern.

3. The surface acoustic wave element as set forth in claim 1;

wherein the two-port surface acoustic wave resonator filter is a longitudinal mode coupled surface acoustic wave resonator filter.

4. The surface acoustic wave element as set forth in claim 1;

wherein at least one of the input side and output side ground conductive patterns comprises at least one of an input capacitance formation conductive pattern and an output capacitance formation conductive pattern, the input capacitance formation conductive pattern forming part of the ground conductive pattern and extended facing to the input side signal conductive pattern in two places, and the output capacitance formation conductive pattern forming part of the ground conductive pattern and extended facing to the output side signal conductive pattern in two places, wherein at least one of capacitances between the ground conductive pattern and the input side signal conductive pattern and between the ground conductive pattern and the output side signal conductive pattern includes capacitance formed between the signal conductive pattern and the capacitance formation conductive pattern extended facing to the signal conductive pattern.

5. The surface acoustic wave element as set forth in claim 1:

wherein at least one of the input side and output side ground conductive patterns has a comb-shaped capacitive electrode at least one of with the input side signal conductive pattern and with the output side signal conductive pattern; and at least one of capacitances between the ground conductive pattern and the input side signal conductive pattern and between the ground conductive pattern and the output side signal conductive pattern includes capacitance formed by the comb-shaped capacitive electrode.

6. A surface acoustic wave device, comprising:

a surface acoustic wave element;

a printed circuit board having an area thereon the surface acoustic element is mounted and having terminals corresponding to an input signal terminal, an output signal terminal and a ground terminal of the surface acoustic wave element; and conductive bump connecting the input signal terminal, the output signal terminal and the ground terminal of the surface acoustic wave element and the terminal of the printed circuit board;

wherein the surface acoustic wave element comprises a piezoelectric substrate and a two-port surface acoustic wave resonator filter having an input IDT and an output IDT;

wherein one of a pair of interdigital electrodes constituting the input IDT is connected to an input side signal conductive pattern including an input side signal wiring and an input signal terminal, the other one being connected to an input side ground conductive pattern including an input side ground wiring and an input side ground terminal, one of a pair of interdigital electrodes constituting the output IDT being wired to an output side signal conductive pattern including an output side signal wiring and an output signal terminal, the other one being connected to an output side ground conductive pattern including an output side ground wiring and an output side ground terminal, at least one of the input side and output side ground conductive patterns being extended facing to both the input side and output side signal conductive patterns to form capacitance.

7. The surface acoustic wave device as set forth in claim 6;

wherein the surface acoustic wave element comprises at least one of an input capacitance formation conductive pattern in which at least one of the input side and output side ground conductive patterns is part of the ground conductive pattern and extended facing to the input side signal conductive pattern in two places, and an output capacitance formation conductive pattern being part of the ground conductive pattern and being extended facing to the output side signal conductive pattern in two places, wherein at least one of capacitances between the ground conductive pattern and the input side signal conductive pattern and between the ground conductive pattern and the output side signal conductive pattern contains capacitance formed between the signal conductive pattern and the capacitance formation conductive pattern extended facing to the signal conductive pattern.

* * * * *